United States Patent [19]
Hirabayashi et al.

[11] Patent Number: 6,078,218
[45] Date of Patent: Jun. 20, 2000

[54] NEGATIVE AMPLIFIER CIRCUIT

[75] Inventors: Atsushi Hirabayashi, Tokyo; Kosuke Fujita, Kanagawa; Kenji Komori, Tokyo; Norihiro Murayama, Chiba, all of Japan

[73] Assignee: Sony Corporation, Tokyo, Japan

[21] Appl. No.: 09/033,109

[22] Filed: Mar. 2, 1998

[30] Foreign Application Priority Data

Mar. 5, 1997 [JP] Japan ..................................... 9-050293

[51] Int. Cl.$^7$ ............................... H23G 3/32; H03F 3/45
[52] U.S. Cl. ........................................... 330/254; 330/258
[58] Field of Search .................................. 330/258, 254, 330/260, 292, 110

[56] References Cited

U.S. PATENT DOCUMENTS 5,465,072  11/1995  Atarodi ................................. 330/254
5,587,689  12/1996  Bowers ................................. 330/254

*Primary Examiner*—Michael B Shingleton
*Attorney, Agent, or Firm*—Frommer, Lawrence & Haug, LLP; William S. Frommer

[57] ABSTRACT

An amplifier circuit in which a differential pair of transistors (1a), (1b) is provided. An impedance (2) of a value $2.Z_e$ is connected in series between the emitters of the transistors (1a), (1b) and these emitters are grounded by way of current sources (3a), (3b) respectively. Input signal sources (4a), (4b) of voltage values $\pm V_{IN}$ are connected to the bases of the transistors (1a), (1b) by way of the base-emitter paths of the transistors (5a), (5b) which form a buffer circuit (10). The emitters of the transistors (5a), (5b) are in turn grounded by way of current sources (6a), (6b) respectively. Further, the collectors of each of the transistors (1a), (1b) are connected to the base of the other transistors by way of the base-emitter paths of the transistors (5a), (5b) respectively.

4 Claims, 4 Drawing Sheets

NEGATIVE AMPLIFIER CIRCUIT

BACKGROUND OF THE INVENTION

The present invention relates to a negative amplifier circuit sitable for use in a high frequency amplifier, a high gain amplifier or the like which is used, for example, in a radio receiver, a television receiver, a satellite broadcasting receiver, a video recorder, a mobile communication apparatus or the like.

In a high frequency circuit and a high gain amplifier circuit which are used, for example, in a television receiver, a gain control amplifier circuit for example as shown in FIG. 1 has been used. In other words, FIG. 1 shows the arrangement of a gain control amplifier circuit.

In FIG. 1, there is provided a differential pair consisting of transistors $61a$, $61b$ and input signal sources $62a$, $62b$ of voltages$\pm V_{IN}$ are connected to the bases of these transistors $61a$, $61b$ respectively. The emitters of the transistors $61a$, $61b$ are grounded by way of current sources $63a$, $63b$ and an emitter resistor 64 of a resistance value $R_E$ is connected between these emitters.

A current control circuit consisting of transistors $66a$, $66b$, $67a$, $67b$ which are controlled by a control voltage source 65 of voltages$\pm V_{C1}$ is connected to the collectors of the transistors $61a$, $61b$. The collectors of the transistors $66a$, $66b$ in this current control circuit are connected to a voltage source $V_{CC}$ by way of collector resistors $68a$, $68b$ of a resistance value $R_C$ and output signal terminals $69a$, $69b$ of voltages$\pm V_0$ are lead out from the collectors of the transistors $66a$, $66b$.

By the way, in the gain control amplifier as shown in FIG. 1, the maximum gain thereof is determined by the ratio of the resistance value $R_C$ of the collector resistors $68a$, $68b$ to the resistance $R_E$ of the emitter resistor 64. Moreover, the maximum S/N is determined by the resistance value $R_C$ of the collector resistors $68a$, $68b$.

First, an explanation of the maximum gain will be provided. If the resistance value $R_C$ of the collector resistors $68a$, $68b$ is made larger to increase the gain in the above mentioned circuit, the circuit will act as a low pass filter (LPF) due to the floating capacities existing in the collectors of the transistors $66a$, $66b$. Accordingly, the gain vs. frequency characteristic of the circuit will be attenuated at higher frequencies.

However, if the resistance value $R_C$ of the collector resistors $68a$, $68b$ is selected to be made smaller in order to extend the frequency characteristic, the gain is lowered. Accordingly, in order to realize an increased gain without an LPF effect, it is necessary to decrease the resistance value $R_E$ of the emitter resistor 64. However, if $R_E$ is decreased, it is necessary to increase the bias current to maintain the dynamic range. In that case, the load resistance should be re-estimated because of the limitations of the power source voltage.

Thus, the tradeoffs between the gain, the frequency characteristic and input/output dynamic ranges limits the amplifier designer's freedom. Further, because, the load resistance of prior amplifier circuits was not variable maximizing the S/N ratio of such amplifiers resulted in a decrease in gain.

For the above reasons, amplifier designers often connect multiple amplifier circuits in cascade in order to obtain a suitable gain, however as a result of using multiple stages the S/N and DG DP of such a circuit decrease relative to a single stage circuit, while the power consumption increases relative to a single stage circuit.

SUMMARY OF THE INVENTION

In view of the above, it is an object of the present invention to solve the problem that in the above gain control amplifier circuit, the freedom of design is narrow because the gain, the frequency characteristic and the like are related to one another and it is necessary to connect multiple stages of amplifier circuits in cascade to obtain the gain which will cause deterioration of the S/N ratio and will increase power consumption.

According to the present invention, therefore, a negative impedance generating circuit is formed by connecting an impedance between the emitters of a differential pair of transistors so as to form a voltage-current converting conductance, and for each transistor, feeding back the collector output of the transistor to the base of the other transistor. When a source is coupled between the collectors of the differential pair, the source load appears as a negative impedance. An amplifier circuit can be formed using such a negative impedance circuit.

DESCRIPTION OF THE PREFERRED EMBODIMENT

In the present invention, a differential pair of transistors are provided, a voltage-current converting conductance is formed by connecting an impedance between the emitters of the differential pair, and for each transistor of the differential pair the collector output of the transistor is back to the base input of the other transistor. The configuration generates a feedback current according to the conductance connected between the emitters so that a source coupled between the collectors of the differential pair "sees" a negative impedance.

Figure 2:
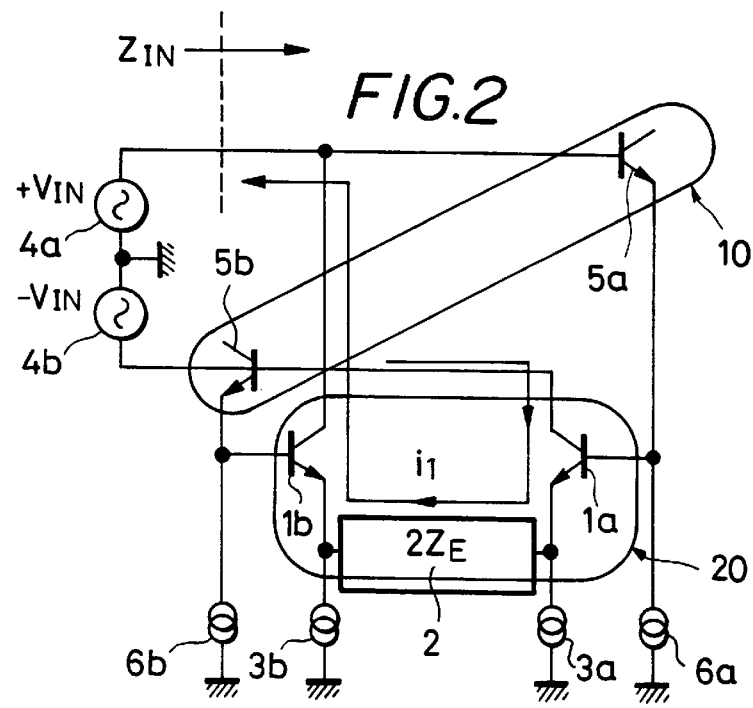
FIG. 2 illustrates an example of a negative impedance generating circuit according to the present invention.

Hereinafter, the present invention will be described with reference to the drawings. FIG. 2 is a diagram showing an example of the arrangement of a negative impedance generating circuit to which the negative amplifier circuit according to the present invention is applied.

In FIG. 2, a differential pair consisting of transistors $1a$, $1b$ are provided. Between the emitters of these transistors $1a$, $1b$ an impedance 2 of value $2Z_E$ is connected in series and the emitters are grounded by way of current sources $3a$, $3b$, respectively.

Input signal sources $4a$, $4b$ of voltages$\pm V_{IN}$ are respectively connected to the bases of the transistors $1a$, $1b$ by way of the base-emitter paths of transistors $5a$, $5b$ which forms a buffer circuit 10. The emitters of the transistors $5a$, $5b$ are grounded by way of current sources $6a$, $6b$, respectively. The collectors of the transistors $1a$, $1b$ are mutually connected to the bases of the other transistors $1a$, $1b$ by way of the base-emitter paths of the transistors $5a$, $5b$ respectively.

Accordingly, in the above circuit, input signals of voltages $\pm V_{IN}$ from the output signal sources 4a, 4b are supplied to the bases of the transistors 1a 1b by way of the buffer circuit 10 formed of the transistors 5a, 5b respectively. A voltage-current converting circuit 20 is formed so as to convert the applied voltage $\pm V_{IN}$ into a current $i_1$. Meanwhile, the buffer circuit 10 also acts to perform a direct-current shift and to increase the input impedance to the bases of the transistors 1a, 1b.

In this circuit, an input impedance $Z_{IN}$ as seen from the input signal source 4a is expressed by the following equation (1).

$$Z_{IN} = \frac{V_{IN}}{-i_1} = ZE \tag{1}$$

Accordingly, in the circuit of FIG. 2, impedance 2 is reflected through the circuit so as to appear to the input signal $\pm V_{IN}$ as a negative impedance of value $-Z_E$. Thus the circuit of FIG. 2 can be referred to as a negative impedance generating circuit.

Figure 1:
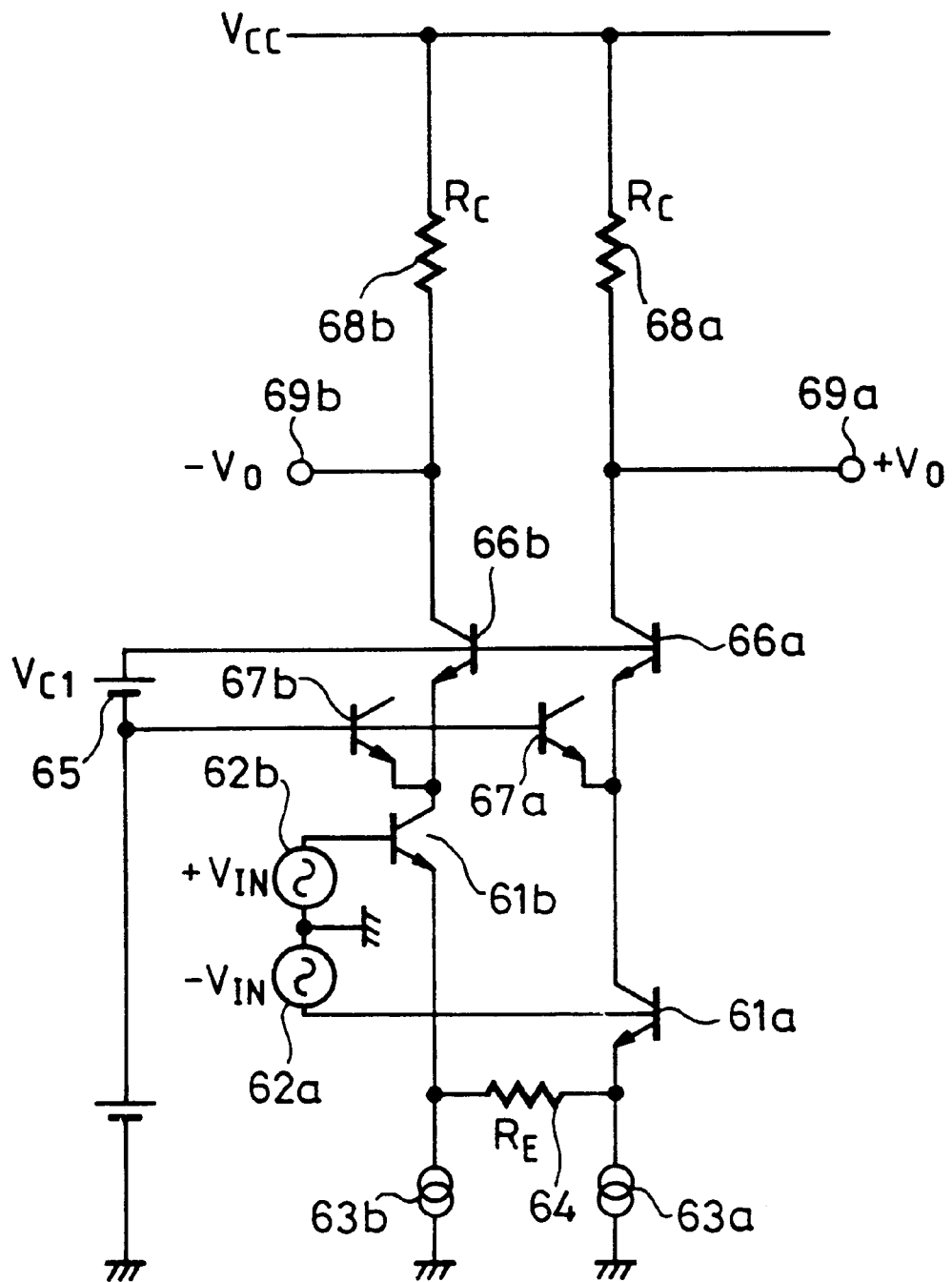
FIG. 1 is a diagram of a gain control amplifier circuit.
Figure 3:
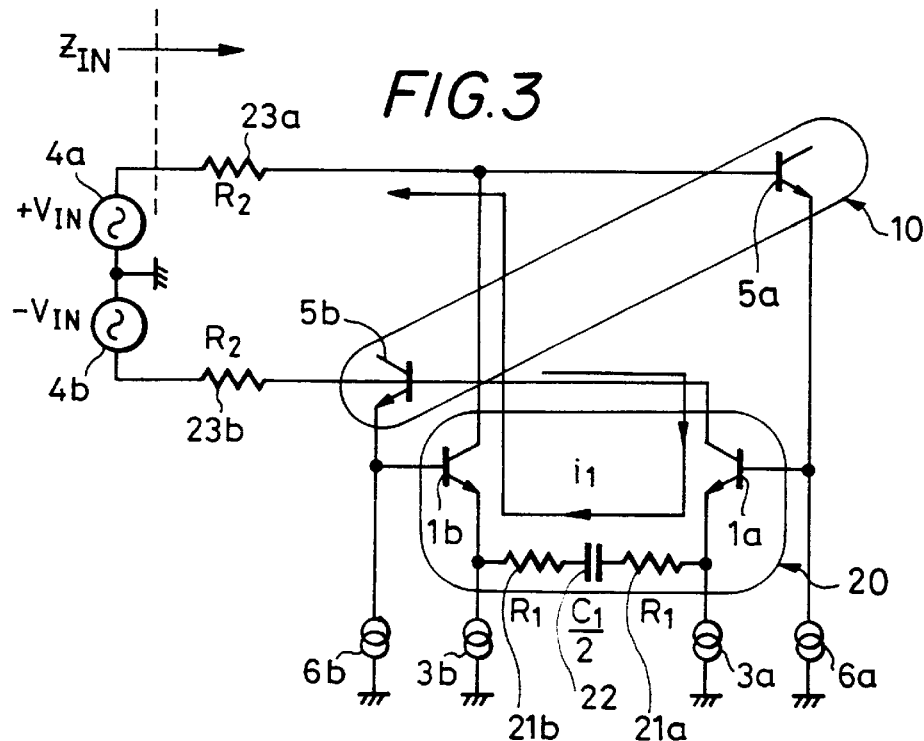
FIG. 3 illustrates an example of a negative capacitance generating circuit according to the present invention.

FIG. 3 shows an example of the arrangement of a negative capacitance generating circuit which is constructed by modifying the negative impedance circuit (a negative amplifier circuit) of FIG. 1. In the following description, the portions of FIG. 3 corresponding to those of the circuit of FIG. 2 are designated by the same reference symbols.

In FIG. 3, the negative capacitance generating circuit is composed such that resistors 21a, 21b of a resistance value $R_1$ and a capacitance 22 of a capacity value $C_1/2$ make up the impedance 2 and are connected in series between the emitters of the transistors 1a, 1b which compose the differential pair of the negative impedance generating circuit as described above. Further, resistors 23b, 23a of a resistance value $R_2$ are symmetrically connected to the collectors of the transistors 1a, 1b respectively.

In this case, an input impedance $Z_{IN}$ as seen from the input signal source 4a is expressed by the following equation (2), if the value of the current flowing through the capacitance 22 is $i_1$.

$$Z_{IN} = \frac{V_{IN}}{-i_1} = R_1 - R_2 - \frac{1}{SC_1} \tag{2}$$

In the circuit of FIG. 3, if it is assumed that $R_1=R_2$, then $Z_{IN}=-1/(SC_1)$ is established.

Accordingly, the input impedance $Z_{IN}$ includes only a negative capacitance so that a negative capacitance generating circuit is formed.

Figure 4:
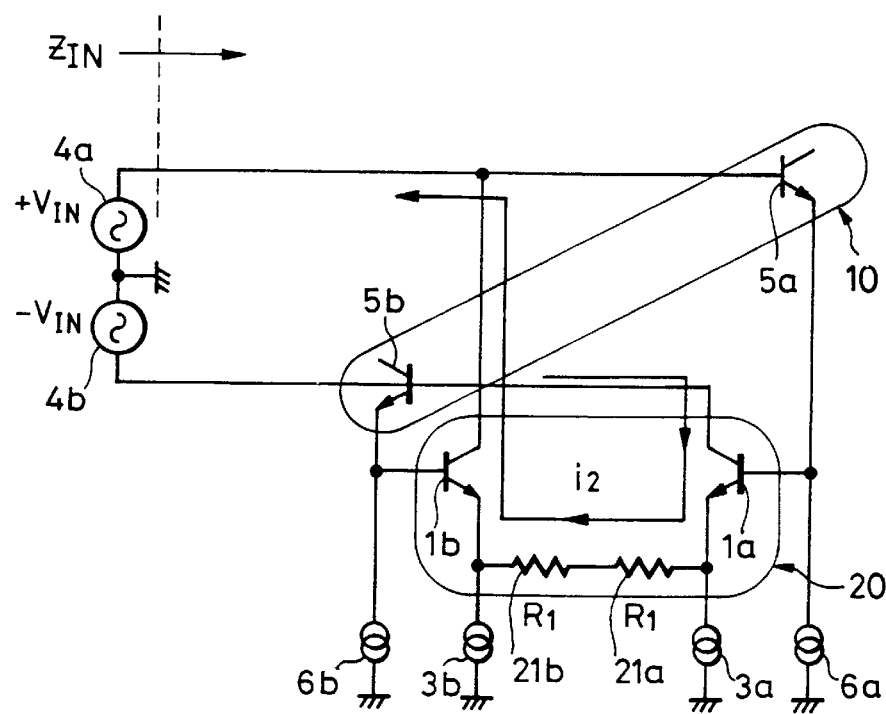
FIG. 4 illustrates an example of a negative resistance generating circuit according to the present invention.

Further, FIG. 4 shows an example of the arrangement of a negative resistance generating circuit which is constructed by modifying the negative impedance circuit (a negative amplifier circuit) of FIG. 2. In the following description, the portions of FIG. 4 corresponding to the circuits of FIG. 2 and FIG. 3 are designated by the same reference symbols.

In FIG. 4, the negative resistance generating circuit is so composed that the resistors 21a, 21b of the resistance value $R_1$ as the impedance 2 are connected in series between the emitters of the transistors 1a, 1b which form the differential pair of the above mentioned negative impedance generating circuit.

In this case, an input impedance $Z_{IN}$ as seen from the input signal source 4a is expressed by the following equation (3), if the value of the current flowing through the resistors 21a, 21b is $i_2$.

$$Z_{IN} = \frac{V_{IN}}{-i_2} = -R_1 \tag{3}$$

Accordingly, in the circuit of FIG. 4, impedance 2 is reflected through the circuit so as to appear to the input signal $\pm V_{IN}$ as a negative resistance of value $R_1$. Thus the circuit of FIG. 4 can be referred to as a negative resistance generating circuit.

Figure 5:
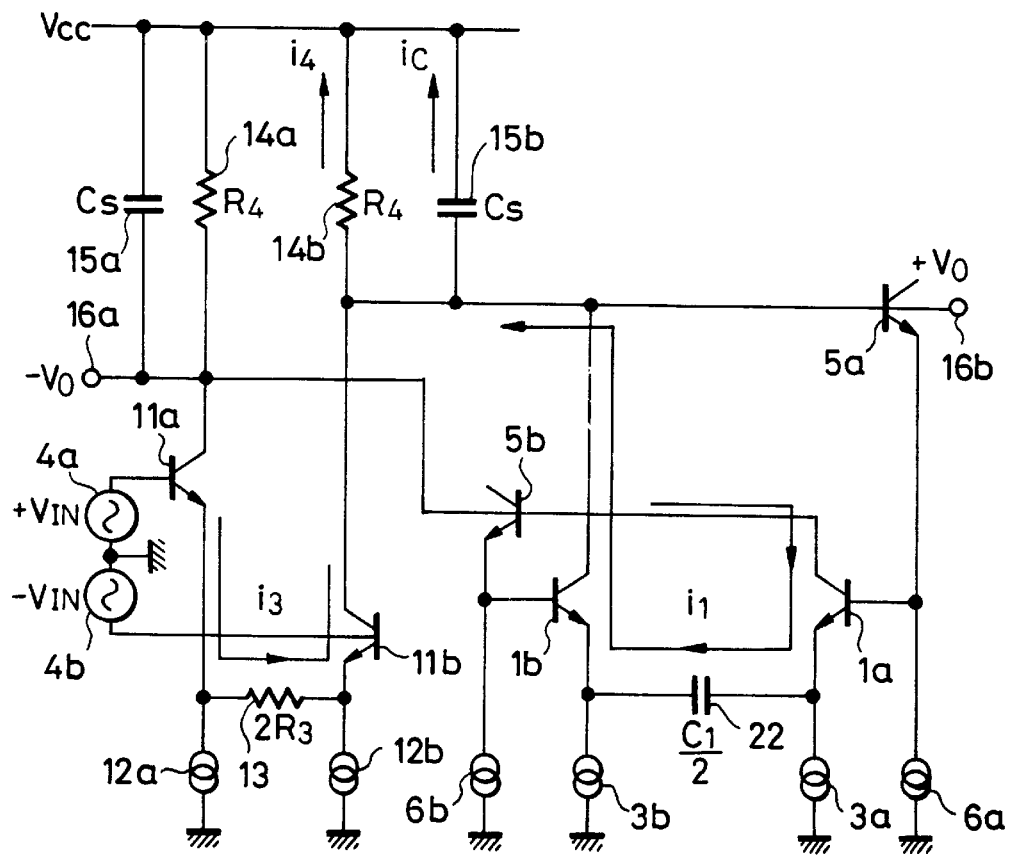
FIG. 5 illustrates an example of the arrangement of a collector floating capacitance canceling circuit according to the present invention.

FIG. 5 shows an example of a negative amplifier circuit according to the present invention, in which a collector floating capacitance canceling circuit is formed as an application of the negative capacitance generating circuit of FIG. 3. In the following description, the portions of FIG. 5 corresponding to those of the circuits shown in FIG. 2, FIG. 3 and FIG. 4 are designated by the same reference symbols.

The collector floating capacitance canceling circuit is formed, for example, by adding the negative capacitance generating circuit of FIG. 3 as a load to a differential amplifier circuit. However, in the FIG. 5 configuration, the resistors 21a, 21b, 23a, 23b shown in FIG. 3 are omitted assuming that the resistances $R_1$, $R_2$ are equal.

Specifically, in FIG. 5, input signal sources 4a, 4b of voltage values $\pm V_{IN}$ are connected to the bases of transistors 11a, 11b respectively, the transistors forming a differential pair. The emitters of the transistors 11a, 11b are grounded by way of current sources 12a, 12b, respectively, and an emitter resistor 13 of a resistance $2R_3$ is connected in series between the emitters of the transistors 12a, 12b.

Further, the collectors of the transistors 11a, 11b are connected to a power source $V_{CC}$ by way of collector resistors 14a, 14b of a resistance value $R_4$ respectively to form a differential amplifier. Capacitors 15a, 15b of a capacity value $C_S$ shown in FIG. 5 respectively represent the sum of the collector floating capacities for transistors 1a, 11a and 1b, 11b.

The output voltage values $\pm V_O$ which are obtained at output terminals 16a, 16b of the collectors of the transistors 11a, 11b are expressed by the following equation (4):

$$\frac{V_O}{R_4} + V_O \cdot SC_S - V_O \cdot SC_1 = \frac{V_{IN}}{R_3} \tag{4}$$

That is, in this circuit, a negative capacitance $(-C_1)$ is added in parallel to the load resistors 14a, 14b by adding a negative capacitance generating circuit as a load.

Accordingly, in this circuit, if the capacitances $C_S$, $C_1$ of the capacitors 15a, 15b which are floating capacitances and the capacitance 22 are equal, the collector floating capacitances are effectively canceled. Accordingly, the usable frequency band of the differential amplifier can be widened and at the same time a larger gain can be obtained by making a load resistance larger. Namely, an amplifier of a predetermined gain and frequency response can be constructed using fewer stages than would be necessary in the prior art.

Figure 6:
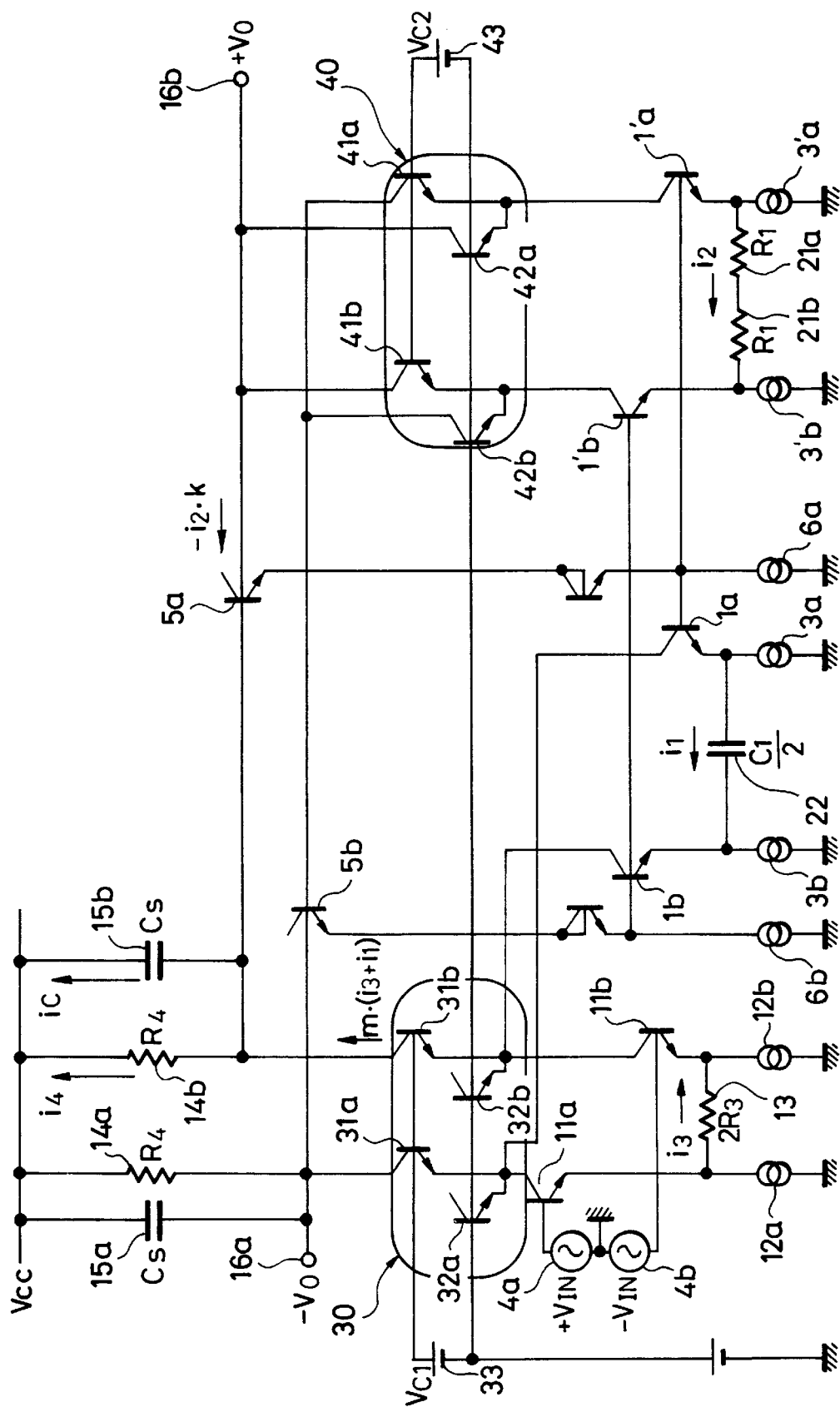
FIG. 6 illustrates an example of a gain control amplifier circuit according to the present invention.

FIG. 6 shows another example of a negative amplifier circuit according to the present invention. In the FIG. 6 configuration a gain control amplifier circuit is formed as an application of the negative capacitance generating circuit of FIG. 3 and the negative resistance generating circuit of FIG. 4. In the following description of FIG. 6, the portions corresponding to the portions of the circuits of FIGS. 2 to 4 are designated by the same reference symbols.

The gain control amplifier circuit is composed of the negative resistance generating circuit shown in FIG. 4, a current control circuit 30 consisting of transistors 31a, 31b, 32a, 32b and a current control circuit 40 consisting of transistors 41a, 41b, 42a, 42b, as well as the collector floating capacity canceling circuit shown in FIG. 5.

As shown in FIG. 6, the current control circuit 30 is connected between the collectors of the transistors 11a, 11b of the differential amplifier and the collector resistors 14a, 14b, and includes the transistors 31a, 31b, 32a, 32b which are controlled by a control voltage source 33 of voltage value±$V_{C1}$. Here, the current flowing through the resistor 13 is assumed to be $i_3$.

A differential pair consisting of transistors 1'a, 1'b are provided, and their bases are respectively connected to the bases of transistors 1a, 1b wherein transistors 1a and 1b form part of the negative capacitance generating circuit in the collector floating capacitance canceling circuit are provided. Emitter resistors 21a, 21b of a resistance value $R_1$ are connected in series between the emitters of the transistors 1'a, 1'b to thereby form a negative resistance generating circuit.

Further, the collectors of the transistors 1'a, 1'b in the negative resistance generating circuit are respectively connected to the bases of the output transistors 5a, 5b in the negative capacitance generating circuit by way of the current control circuit 40, which includes the transistors 41a, 41b, 42a, 42b and a control voltage source 43 of voltage value±$V_{C2}$. The current flowing through resistors 21a, 21b is assumed to be $i_2$.

In this circuit, if the output voltages±$V_0$ obtained at the output terminals 16a, 16b are calculated, assuming that a coefficient applied by the current control circuit 30 is m and a coefficient applied by the current control circuit 40 is k, the voltage value $V_0$ is expressed by the following equation (5).

$$\frac{V_0}{R_4} + V_0 \cdot SC_S - k \cdot i_2 = m \cdot (i_3 + i_1) \quad (5)$$

$$\therefore \frac{V_0}{R_4} + V_0 \cdot SC_S - k \cdot \frac{V_0}{R_1} = m \cdot \frac{V_{IN}}{R_3} + V_0 \cdot SC_1$$

$$\therefore \frac{V_0}{V_{IN}} = \frac{m}{R_3} \cdot \frac{1}{\frac{1}{R_4} \frac{k}{R_1} + S(C_S - m \cdot SC_1)}$$

where $0 < m < +1$ and $-1 < k < 1$

From equation (5) it can be seen that the load impedance appears as a parallel circuit including the emitter resistors 21a, 21b whose resistance value is $R_1$ (negative resistance generating circuit), the collector resistors 14a, 14b whose resistance value is $R_4$ (gain control amplifier circuit), the floating capacitances 15a, 15b of value $C_S$ and the capacitor 22 of value $C_1$.

As can be seen from the equation, the load resistance is maximum when k=1. Also, the condition $R_1 > R_4$ is necessary because the output will reverse if $R_4 > R_1$. It can be seen that if $R_1$ is made close to $R_4$ with the condition of $R_1 > R_4$ being satisfied, the gain increases accordingly.

In order to prevent deterioration in the frequency characteristic caused by the floating capacitances, it is desirable to cancel the capacity of the floating capacitances 15a, 15b by adjusting the value of (m·$C_1$) through control of the coefficient m. Thus, as can be seen from the equation, when $C_1 = C_S$ and k=1, m should be set to 1.

The range of k for which m held at 1 depends on the extent to which collecotr floating capacitances affect the circuit frequency response. However, in fact, considering from the point of S/N, the load resistance should be throttled sufficiently and therefore m=1 should be held while the k is throttled from 1 to −1 and then the m begins to be throttled.

Accordingly, the gain control amplifier of the present invention is characterized in that a delay system which is applied to throttle first the k and then throttle the m exists in one stage amplifier. In the gain control amplifiers of the prior art, such a gain control delay system has not existed in a one stage amplifier.

In the above mentioned circuit, the load resistance which is a noise source becomes a minimum and the S/N can be improved by throttling first the load resistance sufficiently and then throttling the current of the input differential amplifier.

According to the negative amplifier circuit of the present invention, a gain control amplifier circuit can be formed which uses a negative impedance circuit and a pair of differential amplifiers. The negative impedance circuit may be a negative capacitance circuit and/or a negative resistance circuit.

Further, according to the negative amplifier circuit of the present invention, the floating capacitances existing in the collectors of the transistors can be canceled by equivalently forming a negative capacitance with the use of a negative impedance, and at the same time the load resistance of the amplifier can be varied according to a negative resistance formed with the use of the negative impedance.

According to the negative amplifier circuit of the present invention, the frequency characteristic of the amplifier can be improved and the gain for one stage of the amplifier can be increased. Accordingly, a high gain can be achieved by fewer stages of amplifiers as compared with the prior art, and as a result, an improvement in the linearity of the amplifier circuit and a decrease of the amplifier noise can be realized.

Further, according to the negative amplifier circuit of the present invention, when the gain is throttled at a high input level, the S/N can be improved remarkably by varying the negative resistance from minus to plus. Thus, it becomes possible to achieve a lower power consumption, the performance is improved, the area of the IC chip on which the amplifier is fabricated is reduced and the manufacturing cost is reduced drastically.

According to the present invention as set forth above, by forming a negative impedance generating circuit, various negative impedances can be produced within the silicon IC and a high impedance which has been considered difficult to produce in the prior art can be formed. Accordingly, a high gain amplifier circuit can be formed with few components and a large capacitance can be produced within the IC by the use of a small capacitance, resulting in a decrease in the IC chip's area. Further, many advantages can be obtained such as a reduction in power consumption, a reduction in the cost of the IC and its manufacturing, and a decrease in the substrate area of the IC.

Further, according to the present invention, by forming a collector floating capacitance canceling circuit, the collector floating capacitances of the transistors are effectively reduced, and hence the frequency band of the amplifier circuit is broadened. The load resistance can be increased by an amount corresponding to the decrease in the collector floating capacitance, and as a result, the gain for one stage of the amplifier is increased. Accordingly, a desired gain can be obtained with fewer components as compared to the prior art and the chip size of the IC can be made smaller, resulting in advantages such as improvements in the IC characteristics, particularly the S/N, a reduction of power consumption, a reduction of the IC cost, a reduction in the manufacturing cost, and a decrease in the required substrate area.

Further, when forming a gain control amplifier circuit according to the invention for use in providing amplification of tens of decibels, the number of stages of the amplifier and the number of the components forming the circuit can be reduced as compared to the prior art. Accordingly, improvement of the S/N, reduction of power consumption, and operation at a low voltage can be achieved without significant tradeoffs. Further, in the gain control amplifier circuit, the collector load resistance which has been a limit on the maximum S/N becomes small, and therefore the S/N can be improved by several decibels as compared with the prior art. Also, because the IC can be made smaller, other advantages are realized, such as improvement of the characteristics of the IC, particularly an improved S/N ratio, a reduced power consumption, and reduced cost of the IC and its manufacture, and a reduction of the IC substrate area.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A negative amplifier circuit, comprising:

a differential pair of transistors;

a voltage-current converting conductance which is formed by connecting an impedance between emitters of said differential pair of transistors; and a buffer circuit including a first transistor and a second transistor, said first transistor having its base coupled to the collector of one transistor of said differential pair and having its emitter coupled to the base of an other transistor of said differential pair, and said second transistor having its emitter coupled to the base of said one transistor of said differential pair and having its base coupled to the collector of said other transistor of said differential pair;

wherein for each said transistor of said differential pair the base of said transistor is coupled to the base of said other transistor through said buffer circuit to generate a feedback current, and said feedback current makes said conductance appear as a negative impedance to a source connected across the collectors of said differential pair.

2. A negative amplifier circuit, comprising:

a first differential pair of transistors; and a collector capacitance canceling circuit connected between the collectors of said first differential pair, said collector capacitance canceling circuit including a second differential pair of transistors, a voltage-current converting conductance which is formed by connecting an impedance between emitters of said second differential pair, and a buffer circuit made up of a first transistor and a second transistor, said first transistor having its base coupled to the collector of one transistor of said second differential pair and having its emitter coupled to the base of an other transistor of said second differential pair, and said second transistor having its emitter coupled to the base of said one transistor of said second differential pair and having its base coupled to the collector of said other transistor of said second differential pair;

wherein for each said transistor of said second differential pair the base of said transistor is coupled to the base of said other transistor through said buffer circuit to generate a feedback current and said feedback current makes said conductance appear as a negative impedance to a source connected across the collectors of said second differential pair.

3. A negative amplifier circuit according to claim 2, wherein said impedance includes only resistors and said negative amplifier circuit has a variable gain which may be of a positive value or negative value.

4. A negative amplifier circuit according to claim 3, further comprising means for controlling said variable gain.

* * * * *